US009029953B2

United States Patent
Katou et al.

(10) Patent No.: US 9,029,953 B2
(45) Date of Patent: May 12, 2015

(54) SEMICONDUCTOR DEVICE AND MANUFACTURING METHOD THEREOF

(71) Applicant: Renesas Electronics Corporation, Kanagawa (JP)

(72) Inventors: Hiroaki Katou, Kanagawa (JP); Taro Moriya, Kanagawa (JP); Satoshi Uchiya, Kanagawa (JP); Hiroyoshi Kudou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/061,355

(22) Filed: Oct. 23, 2013

(65) Prior Publication Data

US 2014/0138774 A1 May 22, 2014

(30) Foreign Application Priority Data

Nov. 16, 2012 (JP) ................................. 2012-252598

(51) Int. Cl.
*H01L 29/66* (2006.01)
*H01L 21/336* (2006.01)
*H01L 29/78* (2006.01)

(52) U.S. Cl.
CPC .................................. *H01L 29/7831* (2013.01)

(58) Field of Classification Search
CPC ....................................................... H01L 29/78
USPC .......................................... 257/365; 438/284
See application file for complete search history.

(56) References Cited

U.S. PATENT DOCUMENTS

| 5,525,826 | A | * | 6/1996 | Palara | 257/378 |
|---|---|---|---|---|---|
| 7,271,441 | B2 | | 9/2007 | Miyata et al. | |
| 7,919,374 | B2 | | 4/2011 | Ninomiya et al. | |
| 8,035,158 | B2 | * | 10/2011 | Miura et al. | 257/329 |
| 2001/0025984 | A1 | * | 10/2001 | Osawa | 257/330 |
| 2004/0099905 | A1 | * | 5/2004 | Baliga | 257/328 |
| 2005/0151158 | A1 | * | 7/2005 | Kumar et al. | 257/134 |
| 2009/0245543 | A1 | * | 10/2009 | Onodera | 381/174 |
| 2011/0279152 | A1 | * | 11/2011 | Nakahara | 327/110 |
| 2013/0264637 | A1 | * | 10/2013 | Katou et al. | 257/331 |

FOREIGN PATENT DOCUMENTS

| JP | 2002-368218 | 12/2002 |
|---|---|---|
| JP | 2006-165441 | 6/2006 |
| JP | 2006-229182 | 8/2006 |
| JP | 2009-021308 | 1/2009 |

* cited by examiner

*Primary Examiner* — Matthew Landau
*Assistant Examiner* — Igwe U Anya
(74) *Attorney, Agent, or Firm* — Young & Thompson (57) ABSTRACT

A semiconductor device includes a base region of a second conduction type provided over a drain region of a first conduction type, an outer peripheral well region of a second conduction type provided to cover the outer peripheral end of the base region and having an impurity concentration lower than that of the base region, a buried electrode buried in the semiconductor substrate not to overlap the outer peripheral well region, plural gate electrodes connected to the buried electrode and buried in the substrate such that each of them is adjacent to a source region, a gate interconnect provided over the substrate to overlap a portion of the outer peripheral well region in a plan view and connected to the buried electrode, and a grounding electrode provided over the substrate and connected to a portion of the outer peripheral well region not overlapping the gate interconnect in a plan view.

8 Claims, 10 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2012-252598 filed on Nov. 16, 2012 including the specification, drawings, and abstract is incorporated herein by reference in its entirety.

BACKGROUND

The present invention relates to a semiconductor device and a manufacturing method thereof, which provide a technique applicable to a semiconductor device having a vertical transistor.

Transistors forming semiconductor devices include, for example, those having, for example, a structure in which a gate electrode is buried in a trench formed in a semiconductor substrate. The techniques concerning transistors having such structure include, for example, those described in Japanese Unexamined Patent Publications Nos. 2006-165441, 2002-368218, 2009-21308, and 2006-229182.

The technique described in Japanese Unexamined Patent Publication No. 2006-165441 provides a semiconductor device having a super-junction structure in which a gate electrode buried inside a trench and a gate electrode metal film formed over the surface layer are connected by a gate electrode plug. The technique described in Japanese Unexamined Patent Publication No. 2002-368218 provides a power-MOSFET (Metal Oxide Semiconductor Field Effect Transistor) in which a drain bump is formed to an annular. In a technique described in Japanese Unexamined Patent Publication No. 2009-21308, a plurality of gate electrode lead portions for taking a potential from a trench gate electrode are arranged in the longitudinal direction of a trench gate electrode substantially perpendicular to the trench gate electrode. The technique described in Japanese Unexamined Patent Publication No. 2006-229182 discloses a semiconductor device having a gate electrode buried by way of a gate insulating film into a trench in which a P-type substrate region at a medium concentration is formed.

SUMMARY

A transistor having a gate electrode buried in a semiconductor substrate has a base region that forms a channel. The base region is provided in the semiconductor substrate so as to have a conduction type different from that of the semiconductor substrate. In such a transistor, an outer peripheral well region having a conduction type identical with that of a base region and at an impurity concentration lower than that of the base region is sometimes provided in a semiconductor substrate so as to cover the outer peripheral end of the base region.

In the transistor having the base region, it is preferred that withstand voltage is determined at a PN junction between the base region and a semiconductor substrate with a view point of facilitating design. Accordingly, when the outer circumference well region is formed in the semiconductor substrate, it is necessary to avoid a disadvantage that withstand voltage is determined in a PN junction between the outer peripheral well region and the semiconductor substrate. Accordingly, it is desired to improve the withstand voltage at the PN junction between the outer circumference well region and the semiconductor substrate. On the other hand, it is preferred to attain stable operation in the transistor.

Other subjects and novel features will become apparent in view of the descriptions in the present specification and the appended drawings.

According to an aspect of this invention, an outer peripheral well region covering the outer peripheral end of a base region is provided so as not to overlap a buried electrode and connected by way of a contact to a grounding electrode.

According to the aspect of the invention, a semiconductor device which can be designed easily and realize stable operation can be obtained.

DETAILED DESCRIPTION

Preferred embodiments of the present invention are to be described with reference to the drawings. Throughout the drawings, identical constituent elements carry same reference numerals for which description is omitted optionally.

First Embodiment

Figure 1:
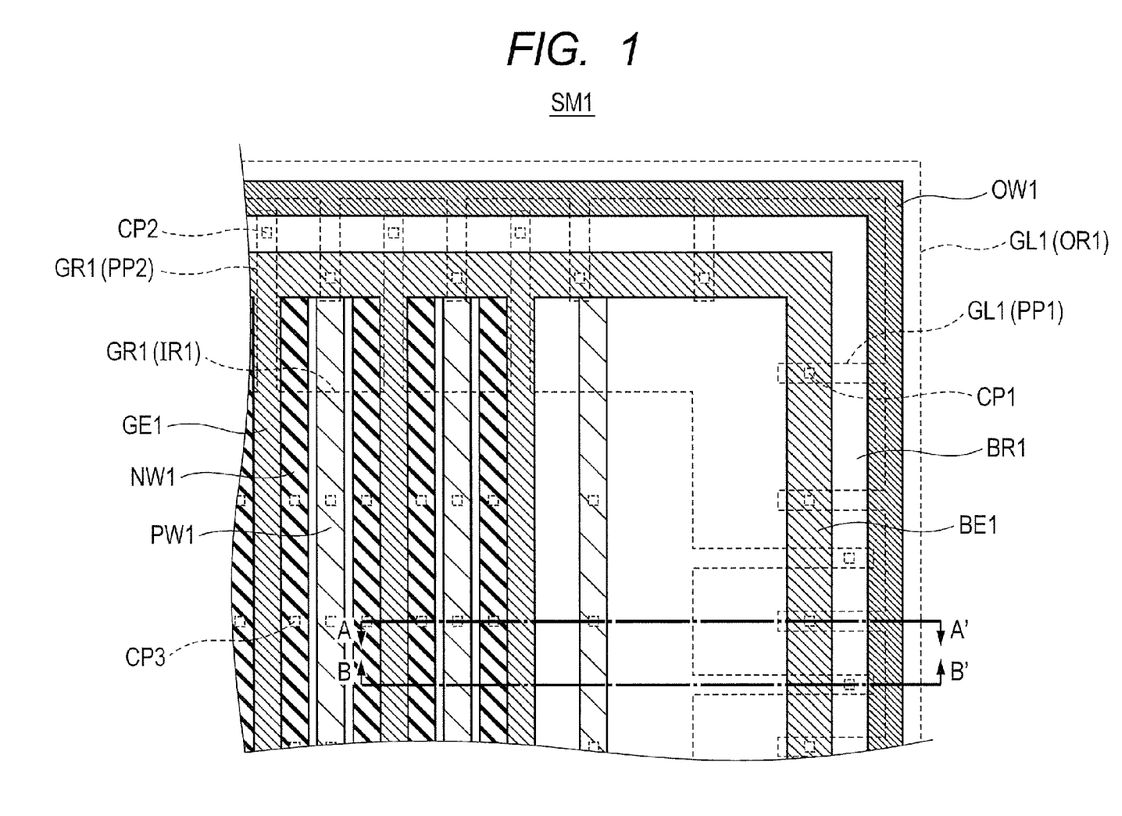
FIG. 1 is a plan view illustrating a semiconductor device according to a first embodiment.
Figure 2A:
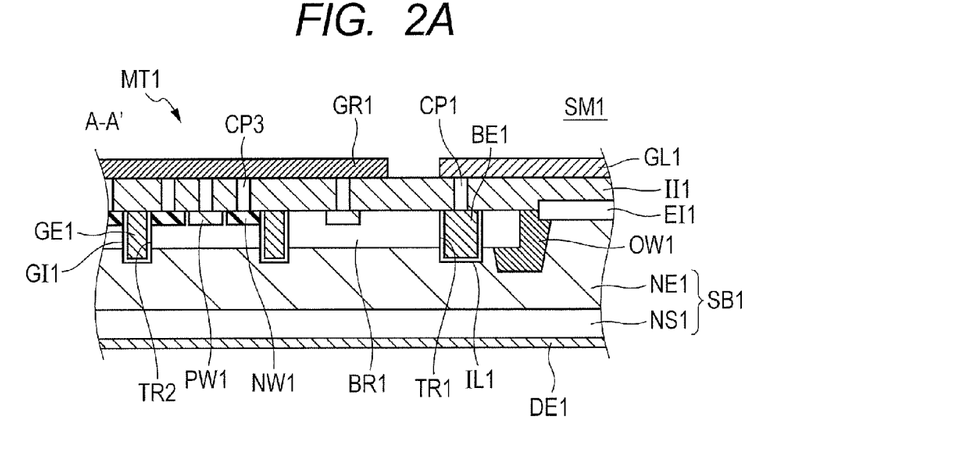
FIGS. 2A and 2B are cross sectional views illustrating the semiconductor device shown in FIG. 1.
Figure 2B:
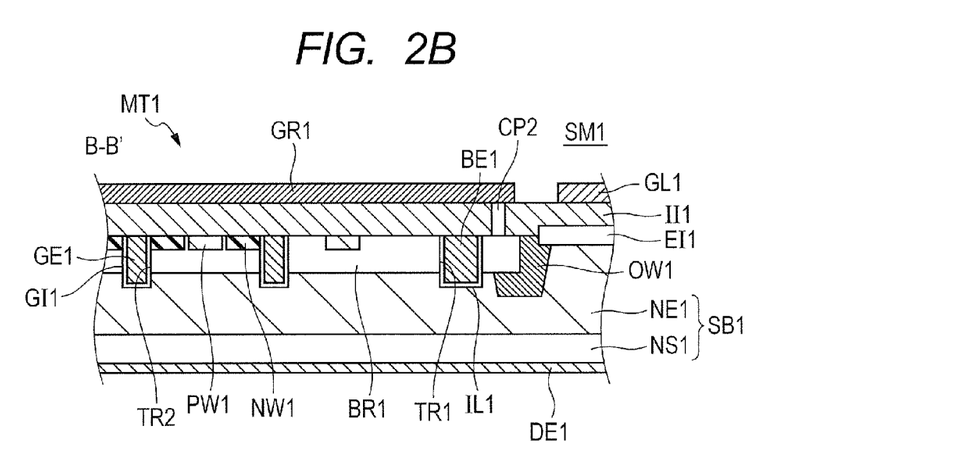

FIG. 1 is a plan view illustrating a semiconductor device SM1 according to a first embodiment. FIG. 2 is a cross sectional view illustrating the semiconductor device SM1 illustrated in FIG. 1. FIG. 2A illustrates a cross section along A-A' in FIG. 1. FIG. 2B illustrates a cross secant along B-B' in FIG. 1.

The semiconductor device SM1 according to this embodiment has a semiconductor substrate SB1, a drain region, a base region BR1, a source region, an outer peripheral well region OW1, a buried electrode BE1, a gate electrode GE1, a gate interconnect GL1, and a grounding electrode GR1.

The drain region is provided on the back surface of the semiconductor substrate SB1. Further, the drain region has a first conduction type. The base region BR1 is provided over the drain region. Further, the base region BR1 has second conduction type different from the first conduction type. The source region is provided in plurality in the base region BR1. Further, the source region has the first conduction type. An outer peripheral well region OW1 is provided in the semiconductor substrate SB1 so as to cover the outer peripheral end of the base region BR1. Further, the outer peripheral well region OW1 has the second conduction type and has an impurity concentration lower than that of the base region BR1.

The buried electrode BE1 is situated in the base region BR1 inward of the outer peripheral well region OW1 in a plan view. Further, the buried electrode BE1 is buried in the semiconductor substrate SB1 on the side of the surface so as not to overlap the outer peripheral well region OW1. Further, the gate electrode GE1 is situated in the base region BR1 inward of the buried electrode BE1 in a plan view. Further, the gate electrode GE1 is electrically connected to the buried electrode BE1. Further, the gate electrode GE1 is buried in plurality in the semiconductor substrate SB1 on the side of the surface so as to be adjacent with the source region. A gate interconnect GL1 is provided over the surface of the semiconductor substrate SB1 so as to overlap a portion of the outer peripheral well region OW1 in a plan view. Further, the gate interconnect GL1 is connected by way of a contact plug CP1 to the buried electrode BE1. The grounding electrode GR1 is provided over the surface of the semiconductor substrate SB1. Further, the grounding electrode GR1 is connected by way of a contact plug CP2 with the outer peripheral well region OW1 at a portion not overlapping the gate interconnect GL1 in a plan view.

In this embodiment, the first conduction type means an N-conduction type. Further, the second conduction type means a P-conduction type. Each of the components included in the semiconductor device SM1 may also have a conduction type opposite to that of this embodiment.

In order to operate a transistor stably, it is preferred to apply a constant voltage to the outer peripheral well region. However, the outer peripheral end of the base region is isolated from the inner region applied with a ground potential by the buried electrode connected to the gate interconnect. Therefore, the outer peripheral well region is sometimes provided so as to be connected to the inside of the base region while covering the region below the buried electrode.

In this case, a withstand voltage may be possibly lowered at a portion of the outer peripheral well region situated below the buried electrode due to distortion of equi-potential lines at the lower end of the buried electrode. Accordingly, it is difficult to determine the withstand voltage at the junction between the base region and the semiconductor substrate.

According to this embodiment, the outer peripheral well region OW1 covering the outer peripheral end of the base region BR1 is provided so as not to overlap the buried electrode BE1. This can suppress lowering of the withstand voltage in the outer peripheral well region OW1 caused by distortion of the equi-potential lines at the lower end of the buried electrode BE1. That is, the withstand voltage at the PN junction between the outer peripheral well region OW1 and the semiconductor substrate SB1 can be improved. Thus, it is possible to determine the withstand voltage at the PN junction between the base region BR1 and the semiconductor substrate SB1. Accordingly, the semiconductor device can be designed easily.

Further, the outer peripheral well region OW1 is connected to the grounding electrode GR1. Accordingly, a ground potential is applied to the outer peripheral well region OW1. Thus, the transistor MT1 can be operated stably.

As described above, according to this embodiment, a semiconductor device that can be designed easily and can realize stable operation can be obtained.

A configuration of the semiconductor device SM1 according to this embodiment and a method of manufacturing the semiconductor device SM1 are to be described specifically.

At first, the configuration of the semiconductor device SM1 is to be described.

The semiconductor device SM1 has a transistor MT1 provided to the semiconductor substrate SB1. The transistor MT1 is a vertical transistor which serves, for example, as a power MOSFET. The semiconductor substrate SB1 having the transistor MT1 is, for example, IPD (Intelligent Power Device) and has a control circuit in addition to the transistor MT1. The semiconductor device SM1 is used, for example, as IPD for electric equipment of automobiles.

The semiconductor substrate SB1 is, for example, a silicon substrate. In this embodiment, the semiconductor substrate SB1 comprises, for example, an N-type substrate NS1 which is a bulk silicon substrate and an N-type epitaxial layer NE1 provided over the N-type substrate NS1. The N-type substrate NS1 and the N-type epitaxial layer NE1 have each an N-conduction type. The N-type epitaxial layer NE1 is formed over the N-type substrate NS1 by an epitaxial growing method. In this embodiment, the N-type substrate NS1 is situated at the back surface of the semiconductor substrate SB1 and the N-type epitaxial layer NE1 is situated to the semiconductor substrate SB1 on the side of the surface respectively.

The N-type substrate NS1 has an impurity concentration which is higher, for example, than that of the N-type epitaxial layer NE1. Thus, the N-type substrate NS1 can serve as the drain region of the transistor MT1.

A base region BR1 is provided in the semiconductor substrate SB1 on the side of the surface. The base region BR1 has a P-conduction type. Further, the base region BR1 is provided in the N-type epitaxial layer NE1 so as to be situated above the N-type substrate NS1 that serves as a drain region. That is, the base region BR1 is provided over the drain region comprising N-substrate NS1. The base region BR1 is provided, for example, so as to be isolated from the N-type substrate NS1.

A plurality of N-type regions NW1 are provided in the base region BR1. The plurality of the N-type regions NW1 are arranged in the base region BR1 so as to be isolated from each other. Further, the N-type regions NW1 each have the N-conduction type. The N-type region NW1 is provided, for example, adjacent to the gate electrode GE1. Therefore, in this embodiment, the N-type region NW1 serves, for example, as a source region of the transistor MT1.

A plurality of P-type regions PW1 are provided in the base region BR1. The P-type regions PW1 each have a P-conduction type. The P-type region PW1 has an impurity concentration which is higher, for example, than that of the base region BR1. Further, a contact plug CP3 connected to the base region BR1 is connected by way of the P-type region PW1 to the base region BR1. Therefore, contact resistance between the base region BR1 and the contact plug CP3 can be decreased.

An outer peripheral well region OW1 is provided in the semiconductor substrate SB1. The outer peripheral well region OW1 is provided in the semiconductor substrate SB1 on the side of the surface so as to cover the outer peripheral end of the base region BR1. The outer peripheral well region OW1 has a P-conduction type. Further, the outer peripheral well region OW1 has an impurity concentration lower than that of the base region BR1.

The outer peripheral well region OW1 is provided over the entire periphery of the base region BR1 so as to cover the outer peripheral end of the base region BR1. That is, the base region BR1 is surrounded by the outer peripheral well region OW1. Accordingly, in this embodiment, the outer peripheral well region OW1 is formed as a frame-like shape having the base region BR1 at the inside thereof. In this configuration, a device forming region of the semiconductor substrate SB1 provided with the transistor MT1 is surrounded by the outer peripheral well region OW1.

In the transistor MT1 having the base region BR1 as a channel, it is preferred that a withstand voltage is determined in a PN junction between a portion of the base region BR1 that forms the transistor MT1 and the semiconductor substrate SB1. In this embodiment, the portion of the base region BR1 that forms the transistor MT1 is a region of the base region BR1 put between the gate electrode BE1.

According to this embodiment, the outer peripheral well region OW1 having an impurity concentration lower than that of the base region BR1 is provided so as to cover the outer peripheral end of the base region BR1. This can improve the withstand voltage at the outer peripheral end of the base region BR1. That is, it is possible to suppress determination of the withstand voltage of the transistor MT1 on the PN junction between a portion of the base region BR1 that does not form the transistor MT1 and the semiconductor substrate SB1. Accordingly, the withstand voltage of the transistor MT1 can be determined easily at the PN junction between the portion of the base region BR1 that forms the transistor MT1 and the semiconductor substrate SB1. Thus, the semiconductor device SM1 can be designed easily.

The outer peripheral well region OW1 is formed more deeply, for example, than the base region BR1. In this embodiment, the outer peripheral well region OW1 is formed such that the peak position for the impurity concentration of the outer peripheral region OW1 is deeper than the peak position for the impurity concentration of the base region BR1. In this case, the outer peripheral well region OW1 is provided so as to entirely cover the end face of the base region BR1. Thus, the withstand voltage at the outer peripheral end of the base region BR1 can be improved sufficiently.

The depth of the outer peripheral well region OW1 can be controlled properly. The outer peripheral well region OW1 may also be formed such that the lower end of the outer peripheral well region OW1 is shallower than the lower end of the buried electrode BE1. The lower end of the outer peripheral well region OW1 means a portion where concentration of the P-type impurity that forms the outer peripheral well region OW1 and the concentration of the N-type impurity that forms the N-type epitaxial layer NP1 are identical each other.

A buried electrode BE1 is buried in the semiconductor substrate SB1 on the side of the surface. The buried electrode EB1 is situated to the inner side of the base region BR1 relative to the outer peripheral region OW1 in a plan view. Further, the buried electrode BE1 is provided so as not to overlap the outer peripheral well region OW1.

In this embodiment, the buried electrode BE1 is provided so as to fill the trench TR1 formed in the semiconductor substrate SB1. Further, the lateral side and the bottom of the buried electrode B1 are covered with an insulating film IL1. Thus, the buried electrode BE1 is electrically separated from the semiconductor substrate SB1. The insulating film IL1 is provided so as to cover the inner wall of the trench TR1.

According to this embodiment, the buried electrode BE1 is provided so as not to overlap the outer peripheral well region OW1. This configuration is free of the problem that the withstand voltage of the outer peripheral well region OW1 is lowered due to distortion of equi-potential lines generated at the lower end of the buried electrode BE1. Accordingly, the withstand voltage of the outer peripheral well region OW1 can be improved.

Further, according to this embodiment, the withstand voltage in the outer peripheral region OW1 can be improved.

Therefore, even when the distance between the N-type substrate NS1 as the drain region and the base region BR1 is shortened, determination of the withstand voltage at the PN junction between the outer peripheral well region OW1 and the semiconductor substrate SB1 can be avoided. Therefore, the on-resistance in the transistor MT1 can also be decreased.

Figure 6:
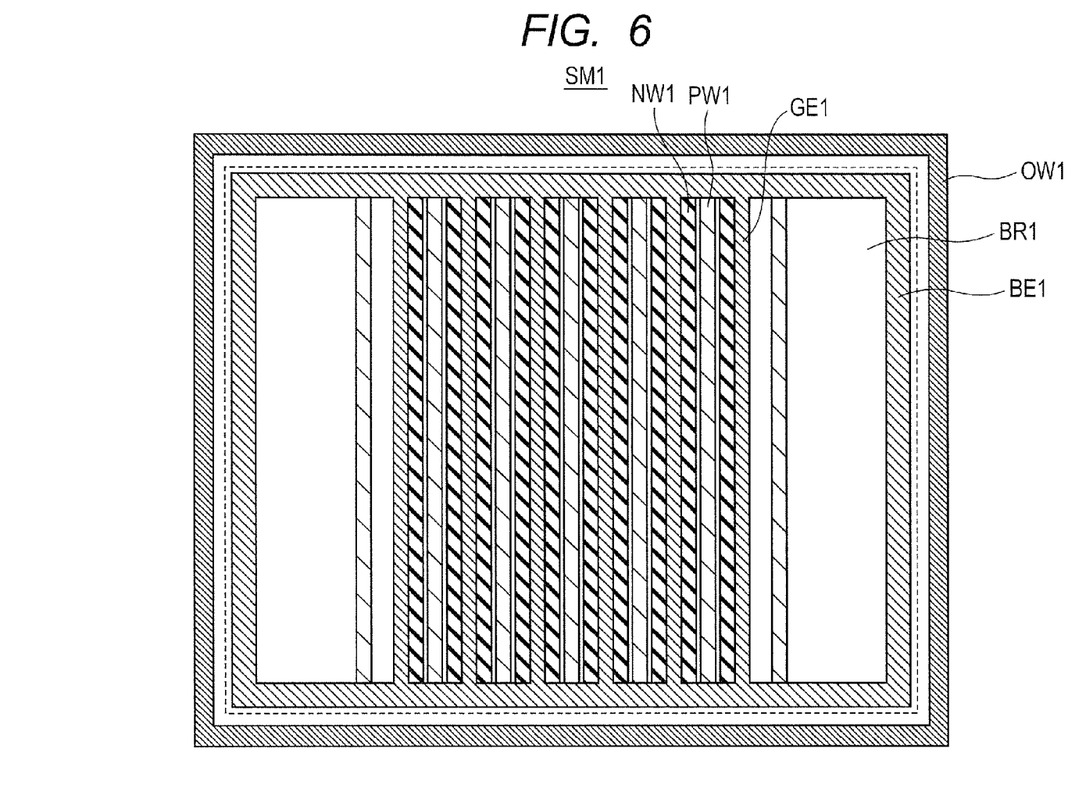
FIG. 6 is a plan view illustrating the semiconductor device shown in FIG. 1.

FIG. 6 is a plan view illustrating the semiconductor device SM1 illustrated in FIG. 1. In FIG. 6, a buried electrode BE1, a gate electrode GE1, a semiconductor substrate SB1, and an outer peripheral well region OW1 are entirely illustrated. A broken line in FIG. 6 shows an inner edge of the outer peripheral well region OW1.

In this embodiment, the buried electrode BE1 is provided, for example, to the inside of the outer peripheral well region OW1 formed, for example, in a frame-like shape being spaced from the outer peripheral well region OW1. Accordingly, the buried electrode BE1 is arranged so as not to overlap the outer peripheral well region OW1. The buried electrode BE1 is arranged so as not to overlap the outer peripheral well region OW1, for example, in the entire region.

The buried electrode BE1 is formed, for example, in a frame-like shape surrounding the device forming region in the semiconductor substrate SB1 in which the transistor MT1 is provided. Accordingly, the gate electrode GE1 and the N-type region NW1 forming the source region are situated inside of the buried electrode EB1 provided in the frame-like shape.

Further, the buried electrode BE1 is provided, for example, such that the lower end of the buried electrode BE1 is deeper than the lower end of the base region BR1. In this configuration, the outer peripheral end of the base region BR1 is separated from other regions of the base region BR1 by the buried electrode BE1. The lower end of the base region BR1 means a portion where the concentration of P-impurity forming the base region BR1 and the concentration of N-impurity forming the N-type epitaxial layer NE1 are identical each other.

In this embodiment, the buried electrode BE1 has a width, for example, larger than that of the gate electrode GE1. The width means a width in the direction perpendicular to the extending direction for each of the buried electrode BE1 and the gate electrode GE1 respectively. Thus, even when the contact plug CP1 causes positional displacement, the contact plug CP1 and the buried electrode BE1 can be connected reliably.

For the trench formed in the semiconductor substrate SB1, the depth tends to increase as the width is larger. Accordingly, in this embodiment, the depth of the trench TR1 for burying the buried electrode BE1 is larger than the depth of the trench TR2 for burying the gate electrode GE1. That is, the lower end of the buried electrode BE1 is situated closer to the back surface of the semiconductor substrate SB1 than the lower end of the gate electrode GE1.

In this embodiment, the outer peripheral well OW1 is provided so as not to overlap the buried electrode BE1. Accordingly, this configuration is free of the problem that the withstand voltage in the outer peripheral well region OW1 is lowered due to the large depth of the buried electrode BE1. Accordingly, connection between the buried electrode BE1 and the contact plug CP1 can be made reliable while suppressing lowering of the withstand voltage at the PN junction between the outer peripheral well region OW1 and the semiconductor substrate SB1.

A plurality of gate electrodes GE1 are buried in the semiconductor substrate SB1 on the side of the surface. The plurality of gate electrodes GE1 are situated to the inner side of the base region BR1 relative to the buried electrode BE1 in a plan view. Further, the plurality of the gate electrodes GE1 are provided such that each of them is adjacent with the N-type region NW1 as the source region.

In this embodiment, the gate electrode GE1 is provided so as to fill the trench TR2 provided in the semiconductor substrate SB1. Further, the lateral side and the bottom of the gate electrode GE1 is covered by the gate insulating film GI1. Thus, the gate electrode GE1 is electrically separated from the semiconductor substrate SB1. The gate insulating film GI1 is formed so as to cover the inner wall of the trench TR2.

In this embodiment, the gate electrodes GE1 is formed so as to be situated to the inner side of the buried electrode BE1 formed, for example, in a frame-like shape. Further, the gate electrode GE1 is provided so as to be connected to the buried electrode BE1. Accordingly, the gate electrode GE1 is connected, for example, to an external terminal by way of the buried electrode BE1 and the contact plug CP1 provided over the buried electrode BE1.

The plurality of gate electrodes GE1 are arranged, for example, parallel to each other. Further, the gate electrodes GE1 are formed such that the end of each of them is connected to the buried electrode BE1. In this embodiment, each of the gate electrodes GE1 is provided, for example, such that both ends of the gate electrode GE1 are connected respectively to two sides of the buried electrode BE1 provided in the frame-like shape and opposing to each other.

The N-type region NW1 is provided, for example, on the lateral side of each of the plurality of gate electrodes GE1 arranged parallel to each other. In this embodiment, N-type regions NW1 are provided, for example, on the lateral sides of a region put between the two adjacent gate electrodes GE1 respectively. In this configuration, a P-type region PW1 is disposed to each lateral side of the gate electrode GE1 in a region put between the two adjacent gate electrodes GE1.

A device isolation film EI1 is provided, for example, in the semiconductor substrate SB1. The transistor MT1 is isolated from other device, for example, by the isolation film EI1.

The device isolation film EI1 is, for example, a LOCOS (Local Oxidation of Silicon) film. At least a portion of the device isolation film EI1 is provided, for example, so as to overlap the outer edge of the outer peripheral well region OW1.

An interlayer insulating film II1 is provided, for example, over the semiconductor substrate SB1. The interlayer insulating film II1 is provided over the semiconductor substrate SB1 so as to cover the base region BR1, the outer peripheral well region OW1, the gate electrode GE1, and the buried electrode BE1.

For example, contact plug CP1, a contact plug CP2, and a contact plug CP3 are buried in the interlayer insulation film II1. The contact plug CP1, the contact plug CP2, and the contact plug CP3 comprise, for example, W.

The contact plug CP1 is provided, for example, so as to be connected to the buried electrode BE1 through the interlayer insulating film II1. Further, a plurality of contact plugs CP1 are buried in the interlayer insulation film II1. In this embodiment, a plurality of contact plugs CP1 are arranged at an equal distance to each other along the buried electrode BE1 provided, for example, in a frame-like shape. The distance in which the contact plugs CP1 are arranged may be different between the side of the buried electrode BE1 and the side adjacent thereto provided in the frame-like shape.

The contact plug CP2 is formed, for example, through the interlayer insulation II1 film so as to be connected to the outer peripheral well region OW1. In this embodiment, the contact plug CP2 is formed, for example, in the base region BR1 for the portion situated to the outer side of the buried electrode BE1. In this configuration, the contact plug CP2 is connected to the outer peripheral well region OW1 by way of the base region BR1 at a portion situated to the outer side of the buried electrode BE1. Further, a plurality of contact plugs CP2 are provided in the interlayer insulation film II1. The plurality of the contact plug CP2 are arranged each at an equal distance along the outer peripheral well region OW1 provided, for example, in a frame-like shape.

The contact plugs CP3 are provided, for example, penetrating the interlayer insulation film II1 over the base region BR1. In this embodiment, the contact plugs CP3 are formed, for example, over the portion of the base region BR1 to a portion situated inward of the buried electrode BE1. Further, a plurality of contact plugs CP3 are provided in the interlayer insulation film II1. A portion of the plurality of contact plugs CP3 is provided so as to be connected to the N-type region NW1 provided in the base region BR1. Further, other portion of the plurality of contact plugs CP3 is provided so as to be connected to the P-type region PW1 provided in the base region BR1.

A gate interconnect GL1 is provided on the surface of the semiconductor substrate SB1. The gate interconnect GL1 is provided so as to overlap a portion of the outer peripheral well region OW1 in a plan view. Further, it is connected by way of the contact plug CP1 to the buried electrode BE1. In this embodiment, the gate interconnect GL1 is provided over the interlayer insulating film II1. Further, the gate interconnect GL1 comprises, for example, Al.

The gate interconnect GL1 is provided so as to overlap a portion of the outer peripheral well region OW1 as described above. Accordingly, the gate interconnect GL1 serves, for example, as a field plate electrode for moderating an electric field in the outer peripheral well region OW1. Thus, the withstand voltage in the outer peripheral well region OW1 can be improved. In this embodiment, the gate interconnect GL1 is provided so as to overlap the outer edge of the outer peripheral well region OW1 provided in the frame-like shape. Accordingly, withstand voltage, particularly, at the outer edge of the outer peripheral well region OW1 can be improved.

The gate interconnect GL1 has an outer part OR1 formed so as to overlap the outer peripheral well region OW1 and a protrusion part PP1 extending from the outer part OR1 to the buried electrode BE1. Further, the gate interconnect GL1 is connected at the protrusion part PP1 to the contact plug CP1.

In the configuration described above, this embodiment can achieve a semiconductor device SM1 capable of supplying a gate potential by way of the gate interconnect GL1 to the gate electrode GE1 while connecting the grounding electrode GR1 to the outer peripheral well region OW1.

The outer part OR1 is provided, for example, in a frame-like shape so as to surround the base region BR1. This is provided so as to overlap the outer edge of the outer peripheral well region OW1 for the entire periphery. Further, the outer part OR1 is provided, for example, so as not to overlap the inner edge of the outer peripheral well region OW1.

The gate interconnect GL1 has, for example, a plurality of protrusions PP1. Each of the protrusions PP1 is connected to the contact plug CP1 provided over the buried electrode BE1. The plurality of protrusions PP1 are arranged, for example, at an equal distance to each other.

A grounding electrode GR1 is provided over the surface of the semiconductor substrate SB1. The grounding electrode GR1 is provided by way of the contact plug CP2 so as to be connected to a portion of the outer peripheral well region OW1 not overlapping the gate interconnect GL1 in a plan view. In this embodiment, the grounding electrode OR1 is provided, for example, over the interlayer insulating film II1.

Further, the grounding electrode GR1 comprises, for example, Al. The grounding electrode GR1 is grounded to the earth.

In this embodiment, the grounding electrode GR1 comprises, for example, a material identical with that for the gate interconnect GL1. Accordingly, the gate interconnect GL1 and the grounding electrode GR1 are formed over the interlayer insulating film II1, for example, by an identical step.

The grounding electrode GR1 has an inner part IR1 situated inward of the buried electrode BE1 in the base region BR1 in a plan view, and a protrusion PP2 extending from the inner part IR1 to the outer peripheral well region OW1. Further, the grounding electrode GR1 is connected at the protrusion PP2 with the contact plug CP2. With such a configuration a semiconductor device SM1 capable of supplying a ground potential to the outer peripheral well region OW1 while connecting the gate interconnect GL1 to the buried electrode BE1 can be achieved.

In this embodiment, the inner part IR1 is provided, for example, so as to be surrounded by the buried electrodes BE1 provided, for example, in a frame-like shape. The inner part IR1 and the buried electrode BE1 are arranged so as to be spaced apart each other in a plan view.

The grounding electrode GR1 has a plurality of protrusion parts PP2. Each of the protrusion parts PP2 is connected to the contact plug CP2, which is connected to the outer peripheral well region OW1. The plurality of protrusion parts PP2 are arranged, for example, at an identical distance to each other.

In this embodiment, the plurality of protrusion parts PP1 and the plurality of protrusion parts PP2 are provided so as to be situated alternately at least in a portion of the region. Thus, the plurality of protrusion parts PP1 and the plurality of protrusion parts PP2 can be arranged each at an equal distance. Therefore, this facilitates supply of a sufficient gate potential to the buried electrode BE1 and a sufficient ground potential to the outer peripheral well region OW1 respectively. The semiconductor device SM1 may also contain a region where the protrusion parts PP1 and the protrusion parts PP2 are not arranged alternately.

The inner part IR1 is connected by way of the contact plug CP3 to the P-type region PW1 and the N-type region NW1. That is, the grounded inner part IR1 is connected to the N-type region NW1 that serves as a source region of the transistor MT1. Accordingly, the inner part IR1 serves as a source electrode of the transistor MT1.

In this embodiment, a source electrode of the transistor MT1 may be provided separately from the grounding electrode GR1.

A drain electrode DE1 is provided at the back surface of the semiconductor substrate SB1. The drain electrode DE1 is provided so as to be in contact, for example, with the N-type substrate NS1 that serves as a drain region of the transistor MT1.

In this embodiment, the transistor MT1 comprises, for example, the gate electrode GE1, the grounding electrode GR1 as a source electrode, the drain electrode DE1, the base region BR1 as a channel, the N-type region NW1 as a source region, and the N-type substrate NS1 as a drain region. Accordingly, the transistor MT1 serves as a vertical transistor.

Figure 7:
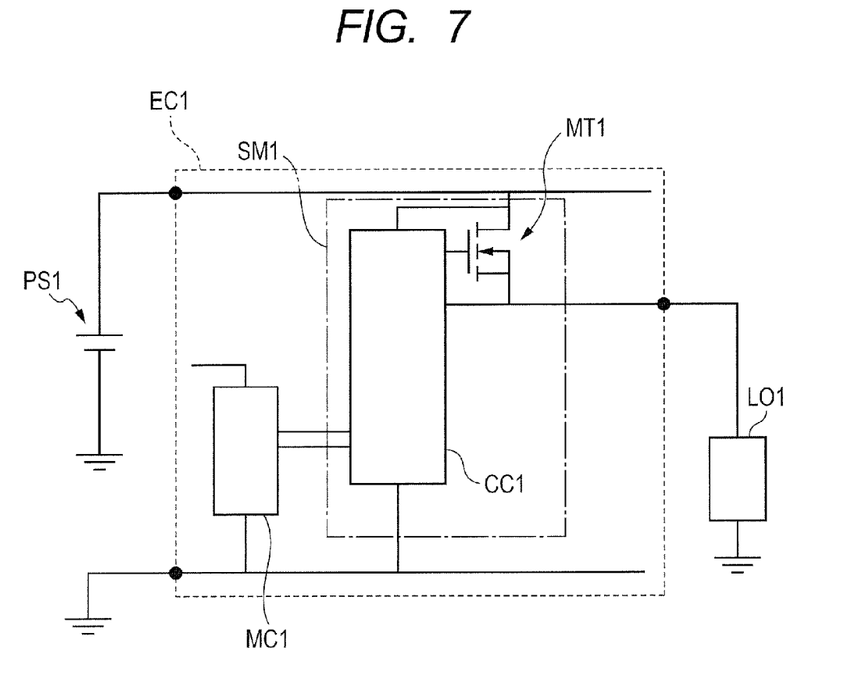
FIG. 7 is a view illustrating a circuit configuration of an electronic device using the semiconductor device illustrated in FIG. 1.

FIG. 7 is a view illustrating a circuit configuration of an electronic device EC1 using the semiconductor device SM1. The electronic device EC1 is used, for example, in an automobile. In this configuration, the semiconductor device SM1 that forms the electronic device EC1 serves, for example, as IPD.

The electronic device EC1 controls power, for example, supplied from a power source PS1 to a load LO1. The load LO1 is, for example, an electronic part such as a head lamp mounted on an automobile. Further, a power source PS1 is, for example, a battery mounted on the automobile.

The electronic device EC1 has, for example, a semiconductor device SM1, and a second semiconductor device MC1 connected by way of an interconnect of a circuit substrate to the semiconductor device SM1. The semiconductor device SM1 has a transistor MT1, for example, as a vertical transistor and a control circuit CC1 formed over the semiconductor substrate SB1. The second semiconductor device MC1 is, for example, a microcomputer.

The electronic device EC1 controls the power, for example, as described below. At first, the second semiconductor device MC1 inputs a control signal to the control circuit CC1. Then, the control circuit CC1 inputs a signal to the gate electrode GE1 of the transistor MT1 in accordance with the control signal inputted from the second semiconductor device MC1. That is, the control circuit CC1 controls the transistor MT1. When the transistor MT1 is controlled, power from the power source PS1 is supplied properly to the load LO1.

Figure 8:
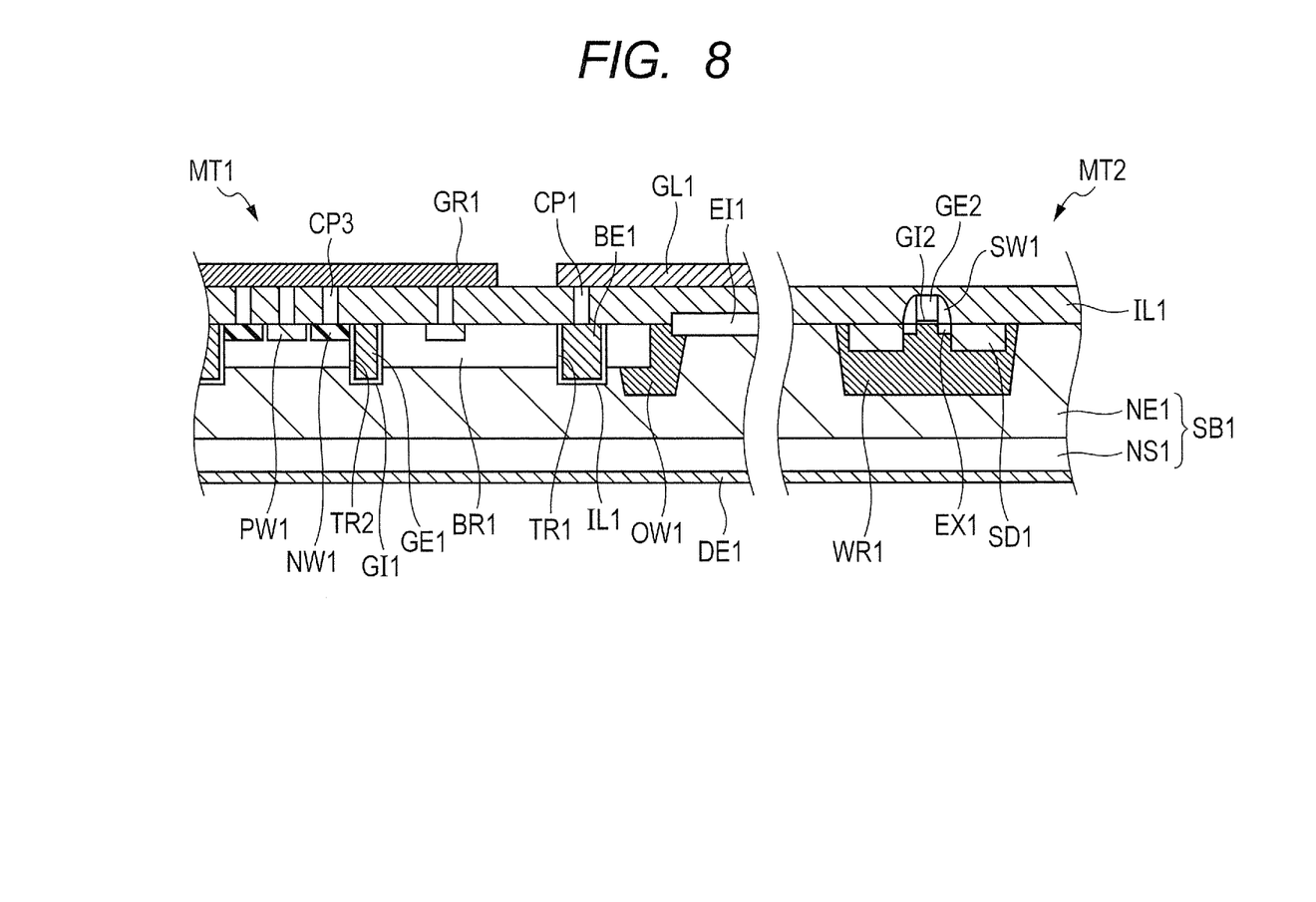
FIG. 8 is a cross sectional view illustrating a first modified embodiment of the semiconductor device illustrated in FIG. 1.

FIG. 8 is a cross sectional view illustrating a first modified embodiment of the semiconductor device SM1 illustrated in FIG. 1. In the semiconductor device SM1 according to this modified embodiment, a transistor MT1 and a transistor MT2 are provided over a semiconductor substrate SB1. The transistor MT2 is a planar transistor and forms, for example, a control circuit.

The transistor MT2 has a gate electrode GE2, a gate insulating film GI2, a side wall SW1, a source • drain region SD1, and an extension region EX1. The gate insulating film GI2 is provided over the semiconductor substrate SB1. The gate electrode GE2 is provided by way of the gate insulating film GI2 over the semiconductor substrate SB1. The side wall SW1 is provided on the lateral side of the gate electrode GE2 and the gate insulating film GI2.

The transistor MT2 is covered, for example, by an interlayer insulating film II1. The source • drain region SD1 is provided in the semiconductor substrate SB1 so as to be situated, for example, on both lateral sides of the gate electrode GE2. The extension region EX1 is provided in the semiconductor substrate SB1, for example, so as to be situated between the source • drain region SD1 and the gate electrode GE2 in a plan view.

A well region WR1 is provided, for example, in the semiconductor substrate SB1. The well region WR1 has, for example, P-conduction type. In this embodiment, the well region WR1 is formed, for example, in an N-type epitaxial layer NE1. The source • drain region SD1 and the extension region EX1 are formed, for example, in the well region WR1.

The well region WR1 is formed, for example, by the step identical with that for the outer peripheral well region OW1. In this case, the depth of the outer peripheral well region OW1 and that of the well region WR1 are identical with each other. In this embodiment, a peak position for the impurity concentration in the outer peripheral well region OW1 and a peak position for the impurity concentration in the well region WR1 are, for example, identical with each other.

In this embodiment, the outer peripheral well region OW1 is not formed below the buried electrode BE1, that is, the depth position of the outer peripheral well region OW1 is not restricted by the depth position of the buried electrode EB1. Therefore, the depth of the outer peripheral well region OW1 can be controlled in accordance with the depth of the well region WR1.

Figure 9:
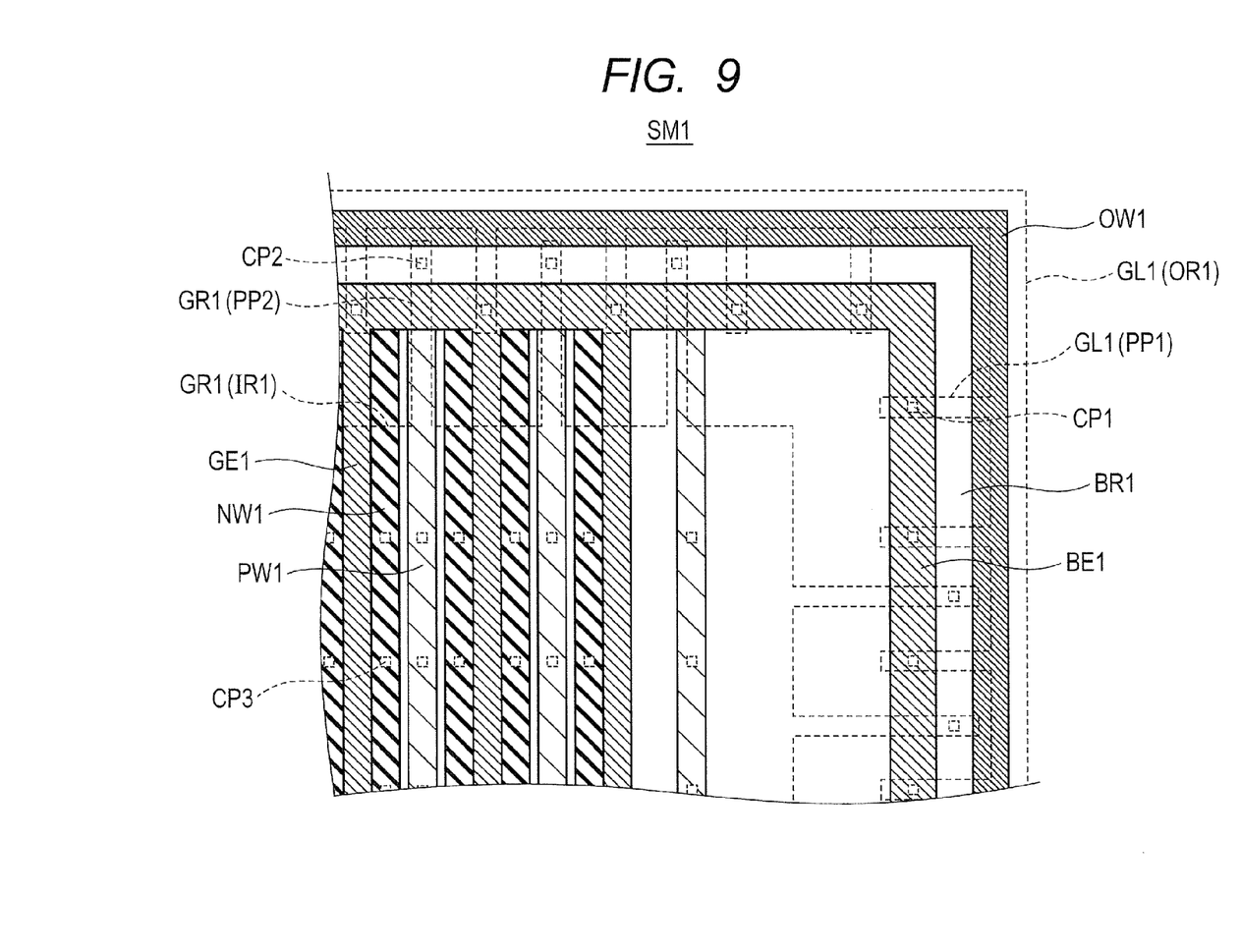
FIG. 9 is a plan view illustrating a second modified embodiment of the semiconductor device illustrated in FIG. 1.

FIG. 9 is a cross sectional view illustrating a second modified embodiment of the semiconductor device SM1 illustrated in FIG. 1. As illustrated FIG. 9, a contact plug CP1 may also be provided so as to be connected to an intersection between the gate electrode GE1 and the buried electrode BE1.

In this configuration, compared with a case of providing the contact plug CP1 so as to be connected to a portion other than the intersection between the gate electrode GE1 and the buried electrode BE1, a substantial interconnect length between the gate electrode GE1 and the gate interconnect GL1 can be shortened. Accordingly, loss upon supply of the gate potential to the gate electrode GE1 can be decreased.

Figure 3A:
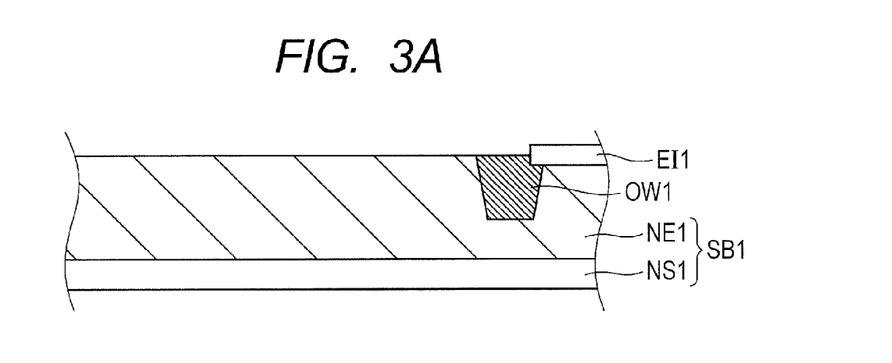
FIGS. 3A and 3B are cross sectional views illustrating a method of manufacturing the semiconductor device illustrated in FIG. 1.
Figure 3B:
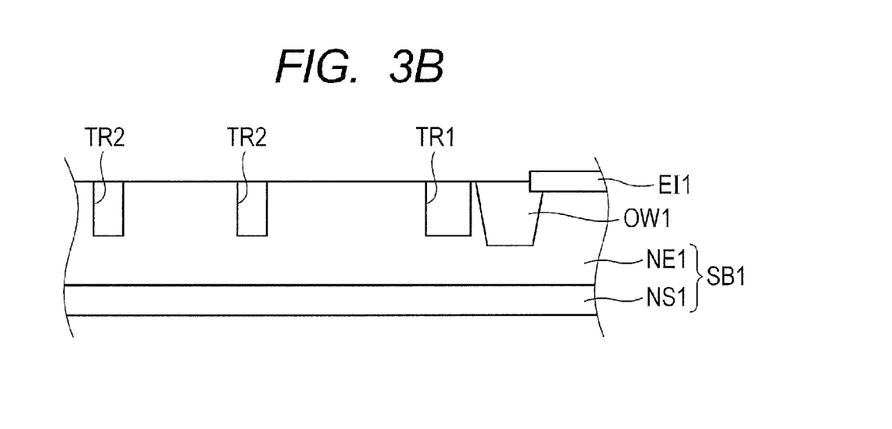
Figure 4A:
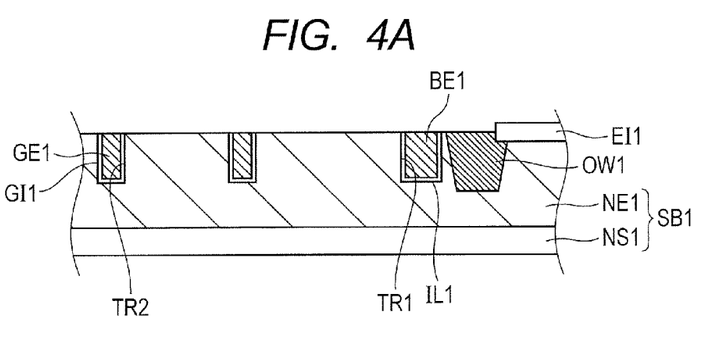
FIGS. 4A and 4B are cross sectional views illustrating a method of manufacturing the semiconductor device illustrated in FIG. 1.
Figure 4B:
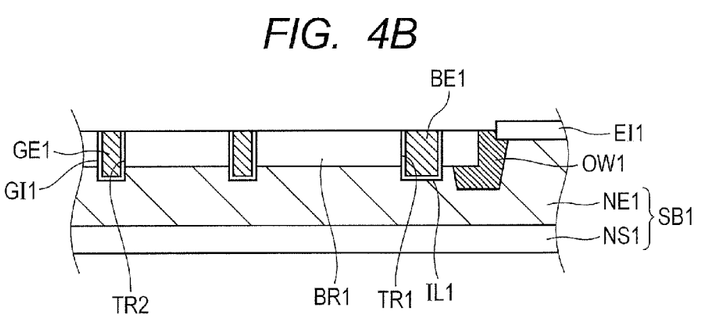
Figure 5A:
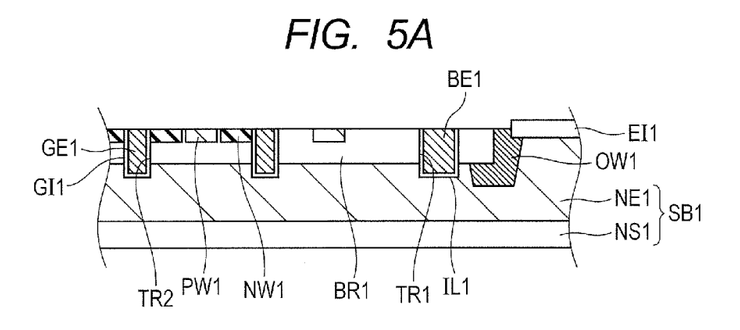
FIGS. 5A and 5B are cross sectional views illustrating a method of manufacturing the semiconductor device illustrated in FIG. 1.
Figure 5B:
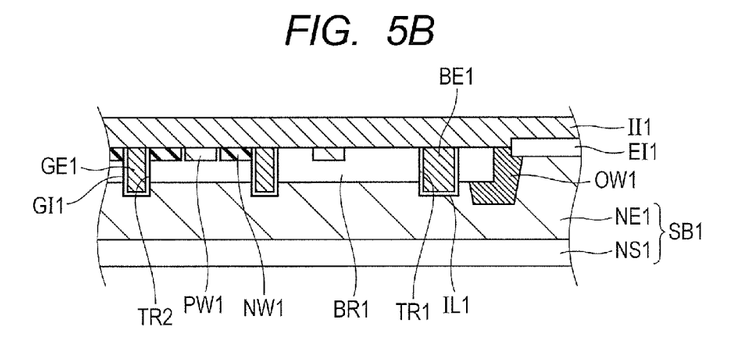

Then, a method of manufacturing the semiconductor device SM1 is to be described. FIG. 3 to FIG. 5 are cross sectional views illustrating a method of manufacturing the semiconductor device SM1 illustrated in FIG. 1. FIG. 3 and FIG. 5 illustrate, particularly, a portion corresponding to the cross section A-A' in FIG. 1.

At first, as illustrated in FIG. 3A, a semiconductor substrate SB1 is provided. The semiconductor substrate SB1 includes an N-type substrate NS1 and an N-type epitaxial layer NE1 provided over the N-type substrate NS1. The N-type epitaxial layer NE1 is provided over the N-type substrate NS1, for example, by an epitaxial growing method. Then, a device isolation film EI1 is formed over the semiconductor substrate SB1. The device isolation film EI1 is formed, for example, by a LOCOS method.

Then, a P-type outer peripheral well region OW1 is formed in the semiconductor substrate SB1. The outer peripheral well region OW1 is formed on the side of the surface of the semiconductor substrate SB1 having the N-type substrate NS1 as a drain region at the back surface. Further, the outer peripheral well region OW1 is provided so as to surround the device forming region that forms a transistor MT1.

The outer peripheral well region OW1 is formed such that the impurity concentration is lower than that of the base region BR1 to be described later. The impurity concentration in the outer peripheral well region OW1 can be controlled properly, for example, by ion implantation conditions.

Then, as illustrated in FIG. 3B, a trench TR1 and a trench TR2 are formed in the semiconductor substrate SB1. The trench TR1 and the trench TR2 are formed by etching the semiconductor substrate SB1, for example, by using a resist pattern provided over the semiconductor substrate SB1 as a mask. In this embodiment, the trench TR1 and the trench TR2 are formed, for example, in the N-type epitaxial layer NE1 so as not to reach the N-type substrate NS1. Further, the trench TR1 and the trench TR2 are provided inside of the device forming region surrounded by the outer peripheral well region OW1.

The trench TR1 is provided so as not to overlap the outer peripheral well region OW1. Further, the trench TR1 is formed, for example, in a frame-like shape.

The trench TR2 is provided in plurality so as to be situated inward of the trench TR1 in the device forming region. Further, the plurality of trenches TR2 are provided so as to be situated inward of the trench TR1 provided, for example, in the frame-like shape. In this case, the trench TR2 is formed, for example, so as to be connected to the end of the trench TR2. For example, the trench TR2 has a width larger than that of the trench TR1. In this case, the lower end of the trench TR2 is situated closer to the back surface of the semiconductor substrate SB1 than the lower end of the trench TR1.

Then, as shown in FIG. 4A, a buried electrode BE1 is buried in the trench TR1 and the gate electrode GE1 is buried in the TR2 respectively. Thus, the buried electrode BE1 situated to the inside of the device forming region so as not to overlap the outer peripheral well region OW1, and a plurality of gate electrodes GE1 situated inward of the device forming region from the buried electrode BE1 are formed in the semiconductor substrate SB1 on the side of the surface.

The buried electrode BE1 and the gate electrode GE1 are formed, for example, as described below. At first, an insulating film is formed over the inner wall of the trench TR1 and the trench TR2 and over the semiconductor substrate SB1. Then, a conductive film is formed over the insulating film so as to fill the trench TR1 and the trench TR2. Then, a portion of the insulating film and the conductive film that is situated outside of the trench TR1 and the trench TR2 is removed. Thus, an insulating film IL1 covering the inner wall of the trench TR1, and the buried electrode BE1 provided over the insulating film IL1 are formed in the trench TR1. Further, a gate insulating film GI1 covering the inner wall of the trench TR2 and the gate electrode GE1 provided over the gate insulating film GI1 are formed in the trench TR2.

Then as illustrated in FIG. 4B, a base region BR1 is formed in the semiconductor substrate SB1 so that the outer peripheral end is covered by the outer peripheral well region OW1. The base region BR1 is formed so as to include therein the buried electrode BE1 and the plurality of the gate electrodes GE1 in a plan view. Further, the base region BR1 is formed so as to have a concentration of impurity higher than that of the outer peripheral well region OW1. In this embodiment, the base region BR1 is formed, for example, in the N-type epitaxial layer NE1.

The outer peripheral well region OW1 is formed such that its lower end is shallower than the lower end of the gate electrode GE1 and the buried electrode BE1. The concentration of impurity and the depth of the base region BR1 can be controlled properly, for example, by ion implantation conditions.

Then, as shown in FIG. 5A, a P-type region PW1 and an N-type region NW1 are formed in the base region BR1. In this embodiment, the order of forming the P-type region PW1 and the N-type region NW1 are not particularly restricted.

Then, as illustrated in FIG. 5B, an interlayer insulating film II1 is formed over the semiconductor substrate SB1. The interlayer insulating film II1 is formed, for example, by a CVD (Chemical Vapor Deposition) method.

Then, a contact plug CP1 connected to the buried electrode BE1 and the contact plug CP2 connected to the outer peripheral well region OW1 are formed in the interlayer insulating film II1. The contact plug CP1 and the contact plug CP2 are formed by filling contact holes provided in the interlayer insulating film II1 with a conductive material.

In this embodiment, a contact plug CP3 is formed in the base region BR1 over a region inward of the buried electrode BE1, for example, simultaneously with the contact plug CP1 and the contact plug CP2.

Then, a gate interconnect GL1 that overlaps a portion of the outer peripheral well region OW1 and connected to the contact plug CP1 is formed over the interlayer insulating film II1. Further, a grounding electrode GR1 connected to the contact plug CP2 is formed together with the gate interconnect GL1 over the interlayer insulating film II1.

In this embodiment, the gate interconnect GL1 and the grounding electrode GR1 are formed, for example, as described below. At first, a conductive film is formed over the entire surface of the interlayer insulating film II1. The conductive film comprises, for example, AL. Then, the conductive film is etched by using a resist pattern as a mask. Thus, the gate interconnect GL1 and the grounding electrode GR1 are formed. According to this embodiment, the gate interconnect GL1 and the grounding electrode GR1 can be formed by an identical step.

Then, a drain electrode DE1 is formed at the back surface of the semiconductor substrate SB1. Thus, a semiconductor device SM1 in which the transistor MT1 is provided to the semiconductor substrate SB1 is formed.

Then, the effect of this embodiment is to be described.

According to this embodiment, the outer peripheral well region OW1 covering the outer peripheral end of the base region BR1 is provided so as not to overlap the buried electrode BE1. Therefore, it is possible to suppress lowering of the withstand voltage in the outer peripheral well region OW1 due to concentration of equi-potential lines at the lower end of the buried electrode BE1. That is, the withstand voltage at the PN junction between the outer peripheral well region OW1 and the semiconductor substrate SB1 can be improved. This can determine the withstand voltage at the PN junction between the base region BR1 and the semiconductor substrate SB1. Accordingly, design for the semiconductor device SM1 can be designed easily.

Further, the outer peripheral well region OW1 is connected to the grounding electrode GR1. Therefore, a ground potential is given to the outer peripheral well region OW1. This enables to operate the transistor MT1 stably.

As described above according to this embodiment, a semiconductor device easy for design and capable of realizing stable operation can be obtained.

Second Embodiment

Figure 10A:
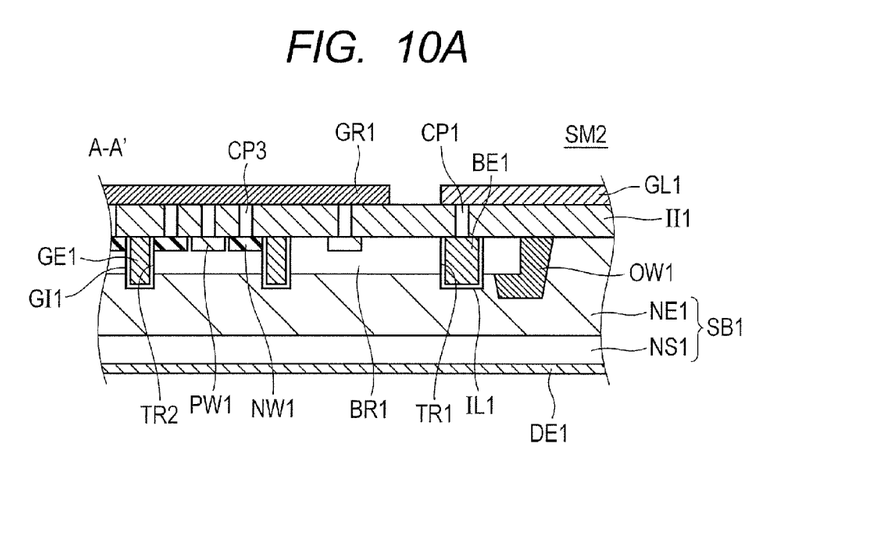
FIGS. 10A and 10B are cross sectional views illustrating a semiconductor device according to a second embodiment.
Figure 10B:
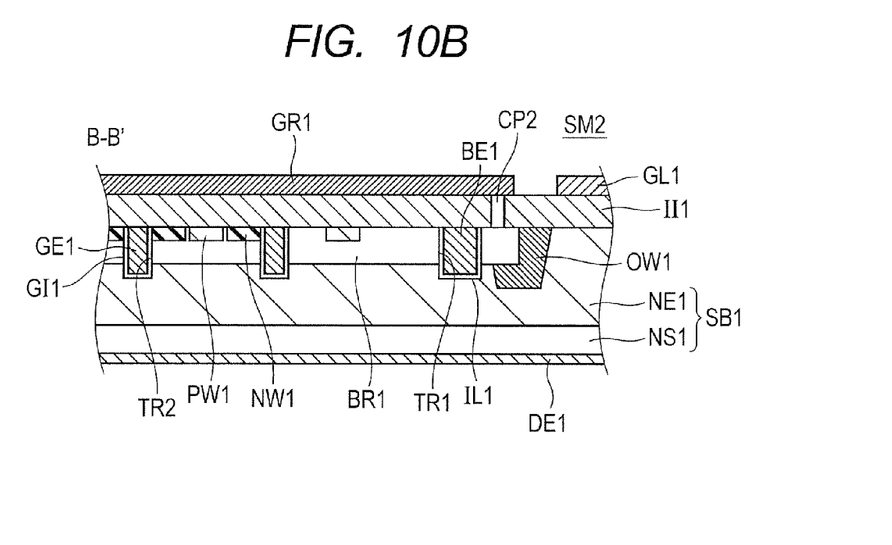

FIG. 10 is a cross sectional view illustrating a semiconductor device SM2 according to a second embodiment, which corresponds to FIG. 2 for the first embodiment. FIG. 10A illustrates a portion corresponding to a cross section A-A' in FIG. 1, and FIG. 10B illustrates a portion corresponds to a cross section B-B' in FIG. 1.

The semiconductor device SM2 according to this embodiment has the same configuration as the first embodiment except for not having a device isolation film EI1 that overlaps the outer edge of the outer peripheral well region OW1.

As illustrated in FIG. 10, the semiconductor device SM2 has no device isolation film EI1 that overlaps the outer edge of the outer peripheral well region OW1. In this embodiment, the device isolation film EL1 is not provided, for example, over the entire surface of the semiconductor substrate SB1.

In the manufacture of the semiconductor device SM having such a configuration, a step of forming the device isolation film EI1 is not necessary. Accordingly, the number of manufacturing steps can be saved.

Further, a heat treatment for forming the device isolation film EI1 is not necessary. Therefore, contamination of the surface of the semiconductor substrate SB1 caused by heat treatment for forming the device isolation film EI1 can be suppressed. Accordingly, the reliability of the semiconductor device can be improved.

A method of manufacturing the semiconductor device SM2 can be performed in the same manner as the method of manufacturing the semiconductor device SM1 excepting that the step of forming the device isolation film EI1 is not present.

Also in this embodiment, the same effect as that of the first embodiment can be obtained.

The present invention made by the present inventors has been described specifically with reference to the preferred embodiments but it will be apparent that the invention is not restricted to such preferred embodiments but can be modified variously within a range not departing the gist thereof.

What is claimed is:

1. A semiconductor device comprising:
a semiconductor substrate;
a drain region of a first conduction type provided on the back surface of the semiconductor substrate;
a base region of a second conduction type different from the first conduction type provided over the drain region;
a plurality of source regions of the first conduction type provided in the base region;
an outer peripheral well region of the second conduction type provided in the semiconductor substrate so as to cover the outer peripheral end of the base region and having a concentration of impurity lower than that of the base region;
a buried electrode situated in the base region inward of the outer peripheral well region in a plan view, and buried in the semiconductor substrate on the side of the surface so as not to overlap the outer peripheral well region;
a plurality of gate electrodes situated in the base region inward of the buried electrode in a plan view, electrically connected to the buried electrode, and buried in the semiconductor substrate on the side of the surface so as to be adjacent with the source regions respectively;
a gate interconnect provided over the surface of the semiconductor substrate so as to overlap a portion of the outer peripheral well region in a plan view and connected to the buried electrode by way of a first contact; and
a grounding electrode provided over the surface of the semiconductor substrate and connected by way of a second contact to a portion of the outer peripheral well region not overlapping the gate interconnect in a plan view.

2. The semiconductor device according to claim 1, wherein the grounding electrode has an inner part situated inward of the buried electrode in the base region in a plan view and a second protrusion part extending from the inner part to the outer peripheral well, and connected at the second protrusion part to the second contact.

3. The semiconductor device according to claim 2, wherein the gate interconnect has an outer part formed so as to overlap the outer edge of the outer peripheral well region and a first protrusion part extending from the outer part to the buried electrode, and connected at the first protrusion part to the first contact.

4. The semiconductor device according to claim 3,
wherein a plurality of the first protrusion parts are provided to the gate interconnect, and
wherein a plurality of the second protrusion parts are provided to the grounding electrode so that the first protrusion parts and the second protrusion parts are situated alternately at least in a portion of the region.

5. The semiconductor device according to claim 1,
wherein the plurality of gate electrodes are arranged parallel to each other and each of the ends thereof is connected to the buried electrode, and
wherein the first contact is provided so as to be connected to the intersection between the buried electrode and the gate electrode.

6. The semiconductor device according to claim 1, wherein a device isolation film that overlaps the outer edge of the outer peripheral well region is not formed in the semiconductor substrate.

7. The semiconductor device according to claim 1, wherein the lower end of the buried electrode is situated nearer to the back surface of the semiconductor substrate than the lower end of the gate electrode.

8. A method of manufacturing a semiconductor device comprising:

forming an outer peripheral well region of a second conduction type different from a first conduction type on the side of the surface of a semiconductor substrate having a drain region of the first conduction type so as to surround a device forming region;

burying a buried electrode situated inward of the device forming region so as not to overlap the outer peripheral well region and a plurality of gate electrodes electrically connected to the buried electrode and situated inward of the buried electrode in the device forming region in the semiconductor substrate on the side of the surface;

forming a base region of the second conduction type which is covered at the outer peripheral end by the outer peripheral well region, including the buried electrode and the plurality of gate electrodes in the inside in a plan view and having a concentration of impurity higher than that of the outer peripheral well region;

forming an interlayer insulating film over the semiconductor substrate;

forming a first contact connected to the buried electrode and a second contact connected to the outer peripheral well region in the interlayer insulating film; and forming a gate interconnect that overlaps a portion of the outer peripheral well region in a plan view and is connected to the first contact, and a grounding electrode connected to the second contact over the interlayer insulating film.

* * * * *